(12) United States Patent
Okimoto et al.

(10) Patent No.: US 9,617,634 B2
(45) Date of Patent: Apr. 11, 2017

(54) SPUTTER DEVICE

(75) Inventors: Tadao Okimoto, Takasago (JP); Hiroshi Tamagaki, Takasago (JP)

(73) Assignee: Kobe Steel, Ltd, Kobe-shi (JP)

( * ) Notice: Subject to any disclaimer, the term of this patent is extended or adjusted under 35 U.S.C. 154(b) by 1429 days.

(21) Appl. No.: 13/060,376

(22) PCT Filed: Aug. 13, 2009

(86) PCT No.: PCT/JP2009/064288
§ 371 (c)(1),
(2), (4) Date: Feb. 23, 2011

(87) PCT Pub. No.: WO2010/026860
PCT Pub. Date: Mar. 11, 2010

(65) Prior Publication Data
US 2011/0147206 A1    Jun. 23, 2011

(30) Foreign Application Priority Data
Sep. 8, 2008 (JP) .................................. 2008-229805

(51) Int. Cl.
*C23C 14/00* (2006.01)
*C23C 14/34* (2006.01)
*H01J 37/32* (2006.01)
*H01J 37/34* (2006.01)

(52) U.S. Cl.
CPC ...... *C23C 14/3464* (2013.01); *C23C 14/3485* (2013.01); *H01J 37/32027* (2013.01); *H01J 37/34* (2013.01); *H01J 37/3444* (2013.01)

(58) Field of Classification Search
USPC .................................................... 204/298.08
See application file for complete search history.

(56) References Cited

U.S. PATENT DOCUMENTS

| 4,999,096 A | 3/1991 | Nihei et al. |
| 5,175,608 A | 12/1992 | Nihei et al. |
| 7,081,186 B2 | 7/2006 | Ehiasarian et al. |

(Continued)

FOREIGN PATENT DOCUMENTS

| DE | 10 2006 017 382 A1 | 5/2007 |
| DE | 10 2006 021 994 A1 | 11/2007 |

(Continued)

OTHER PUBLICATIONS

International Search Report issued Nov. 17, 2009 in PCT/JP09/64288 filed Aug. 13, 2008.

(Continued)

*Primary Examiner* — Keith Hendricks
*Assistant Examiner* — Timon Wanga
(74) *Attorney, Agent, or Firm* — Oblon, McClelland, Maier & Neustadt, L.L.P.

(57) ABSTRACT

In a sputter device (1), power of a DC power source (20) is sequentially distributed and supplied in a time division pulse state to a plurality of sputter evaporation sources (4). A power source (10) provided to each of the sputter evaporation sources (4) supplies continuous power to each of the sputter evaporation sources (4). The sputter device (1) having the configuration requires no DC pulse power source to be provided to each of the sputter evaporation sources (4), which reduces the device cost.

6 Claims, 3 Drawing Sheets

(56) References Cited

U.S. PATENT DOCUMENTS

| | | |
|---|---|---|
| 2004/0055881 A1 | 3/2004 | Christie |
| 2005/0098430 A1* | 5/2005 | Tuymer et al. .......... 204/298.08 |
| 2006/0278518 A1* | 12/2006 | Kouznetsov .............. 204/192.1 |
| 2008/0190758 A1 | 8/2008 | Papachristos et al. |

FOREIGN PATENT DOCUMENTS

| | | |
|---|---|---|
| JP | 2-138456 A | 5/1990 |
| JP | 2002 161359 | 6/2002 |
| JP | 2003 129234 | 5/2003 |
| JP | 2003-129234 A | 5/2003 |
| JP | 2004 217973 | 8/2004 |
| JP | 2006 263929 | 10/2006 |
| JP | 2008 512567 | 4/2008 |
| JP | 2008 156743 | 7/2008 |
| WO | 98 40532 | 9/1998 |
| WO | 2004 029322 | 4/2004 |

OTHER PUBLICATIONS

Kouznetsov, Vladimir et al., "A novel pulsed magnetron sputter technique utilizing very high target power densities", Surface and Coatings Technology, vol. 122, pp. 290-293, (1999).

Office Action issued Dec. 18, 2012 in Japanese Patent Application No. 2008-229805 with English language translation.

European Search Report Issued Sep. 18, 2015 in Patent Application No. EP 0981 1389.

* cited by examiner

SPUTTER DEVICE

TECHNICAL FIELD

The present invention relates to a sputter device for forming film on objects to be processed by a sputtering method.

BACKGROUND ART

The sputtering method is a type of physical vapor deposition techniques, in which glow discharge is generated with an electrode attached with film material (target) as a cathode in a vacuum container with inert gas such as Ar being introduced thereinto, so that ions generated in the discharge collide against the cathode with an energy of several hundreds of electron volts corresponding to the discharge voltage to form film on a substrate by deposition of particles released as a reaction of the collision. The film forming process is used as a practical film forming process, which can generate even more intense glow discharge with a magnetron sputtering method in which a magnetic field is applied near the surface of the target.

A problem sometimes pointed in such a sputtering method is that the formed film is not dense enough due to small energy of particles depositing on substrates.

In glow discharge in general sputtering, ionized target particles (sputtering particles) are small in number, but if sputtering particles can be ionized somehow, dense film could be obtained. Ionized sputtering particles are given energy to head to the substrate side by a negative bias applied to substrates on which film is formed (objects to be processed) or a substrate holder for holding the substrates. The energy will act for densification such as to increase film bonding strength, providing dense film as a result.

Various methods have been proposed to solve the problem, one of which is the proposed technology that generates discharge for film forming in a pulsed manner with very high power density.

For example, Patent Document 1 proposed for magnetron sputtering that DC pulses be applied to the target so as to form substantially uniform plasma by applying pulses with negative voltages with sharp rising edges to the target and causing the gas in front of the target to be fully ionized very rapidly. The document disclosed a specific pulse condition as a favorable condition, which is 0.1 kW to 1 MW for the power during pulsing; 50 µs to 1 ms, more preferably 50 to 200 µs, most preferably 100 µs for the pulse width; 10 ms to 1000 s, preferably 10 to 50 ms for the pulse intervals; and 0.5 to 5 kV for the pulse voltage.

The inventor of the Patent Document 1, Kouznetsov, reported in a Non-Patent Document 1 that an experiment of film forming was carried out with a peak power of 100 to 500 kW (equivalent to a target power density of 0.6 to 2.8 kW/cm$^2$), an Ar pressure of 0.06 to 5 Pa, a pulse width of 50~100 us and a repetition frequency of 50 Hz, and that, as a result, the ion current was as high as 1 A/cm$^2$ on a substrate of film forming and the evaporated target vapor was ionized at about 70%. Due to a high ratio of ionization of vapor used for film forming, it is expected to obtain high adhesiveness between the film and the substrate as well as possibly dense film formation.

Patent Document 2 disclosed that a target material such as chromium was sputtered by adding a power of 1 kW/cm$^2$ or more to the target, and that the sputtered sputtering particles were ionized to be used for pre-treatment of substrates.

Patent Document 3 proposed an opposing target sputter device and disclosed that ionization was recognized with sputtering particles sputtered with a maximum volume power density of 83 W/cm$^3$ or more, which is obtained from the DC power supplied to the targets divided by the volume of the region enclosed by opposing targets. In this case, the distance between the opposing targets was 1 cm, the area of a target was 12 cm$^2$ (2 cm×6 cm), and the total target area was 24 cm$^2$. This corresponds to a power density of 41.5 W/cm$^2$ when converted to a power density per target area.

Summering up these conventional technologies of Patent Documents 1 to 3 and Non-Patent Document 1, it is understood that providing a target with a power of 41.5 W/cm$^2$ or more in power density is useful for process utilizing ionization of a target material (ionization of sputtering particles), which ionization may not be otherwise obtained in general sputtering, but the power differs depending on the forms of cathodes. It is understood that providing a power of 0.6 kW/cm$^2$ or more in power density to a target becomes useful process in the planer magnetron sputtering method.

In the above-mentioned high-power pulse sputtering method that supply DC high-power pulses to the target (high-power pulse sputtering), however, the target material is ionized in a large quantity and the ionized target particles (sputtering particles) are electrically charged positively, which will be recovered by the target having a negative potential, resulting in reduction of the film forming rate corresponding thereto.

Patent Document 4 disclosed a device that solves the problem of the reduction of film forming rate. The device disclosed in Patent Document 4 comprises a DC power source, a DC pulse power source comprising a pulse circuit and a DC power source, a pair of a cathode and an anode, wherein the device supplies, between the cathode and the anode, high-power DC pulse power for a high-power pulse sputtering method to be superimposed on DC power for a general DC sputtering method. The device is adapted to secure a film forming rate to objects to be processed by continuously supplying the DC power to the cathode, where a target is loaded, as well as to form dense film by ionizing sputtering particles sputtered during the application of the DC pulse power intermittently superimposed on the DC power.

In the case of a sputter device in which a sputter evaporation source, i.e., the electrode where a target is loaded, is supplied with continuous DC power and intermittent high-power DC pulse power to be superimposed thereon, an extremely high-power DC pulse power source is required so that high-power DC pulse power such as of a power density of 0.6 kW/cm$^2$ to 2.8 kW/cm$^2$, for example, can be supplied to the sputter evaporation source having a large size, where a target is loaded, when making film formation onto objects to be processed having a large film forming area. Therefore, considering production in a large quantity, it would be technically difficult to obtain such a DC pulse power source.

On the other hand, in order to achieve production in a large quantity, if a plurality of sputter evaporation sources are disposed and DC pulse power sources are each provided to each of the sputter evaporation sources for film formation onto objects to be processed having a large film forming area, each output of the DC pulse power sources could be reduced. This, however, has a disadvantage that a DC pulse power source is required to each of the sputter evaporation sources, as a result, the sputter device becomes expensive.

CONVENTIONAL ART DOCUMENTS

Non-Patent Document

Non-Patent Document 1: Kouznetsov et al., "A novel pulsed magnetron sputter technique utilizing very high target power densities", Surface and Coatings Technology, 122 (1999) 290-293

Patent Documents

Patent Document 1: International Patent Publication WO 98/40532
Patent Document 2: U.S. Pat. No. 7,081,186
Patent Document 3: JP 2008-156743 A
Patent Document 4: JP 2006-500473 A
Patent Document 5: JP 2003-129234 A

SUMMARY OF INVENTION

The present invention is made in view of the above circumstances and the objective of the invention is to provide a sputter device that requires no DC pulse power source to be provided to each of the sputter evaporation sources, which reduces the device cost.

In a sputter device according to the present invention, power of a DC voltage generating unit is sequentially distributed and supplied in a time division pulse state to each of a plurality of sputter evaporation sources, and a power source provided to each of the sputter evaporation sources supplies continuous power to each of the sputter evaporation sources. Therefore, the sputter device having such configuration requires no DC pulse power source to be provided to each of the sputter evaporation sources, which reduces the device cost.

The above-mentioned and other objectives, features and advantages of the present invention will become clear with reference to the detailed description below with attached drawings.

EMBODIMENTS FOR CARRYING OUT THE INVENTION

Embodiments according to the present invention are now described with reference to the drawings. Components in individual drawings with the same reference numbers denote the same components and the description thereof may be omitted arbitrarily.

Figure 1:
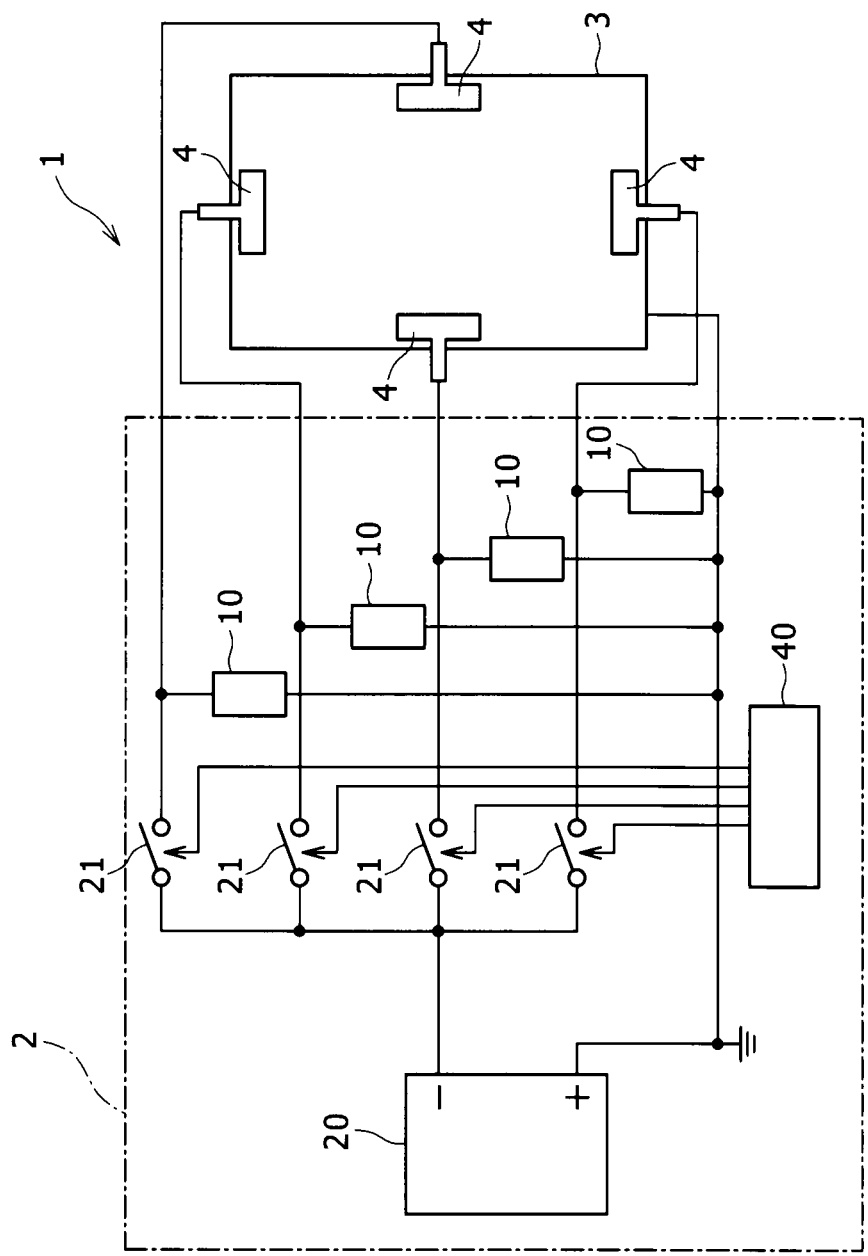
FIG. 1 is a schematic view illustrating a configuration of a sputter device of a first embodiment of the present invention.

FIG. 1 is a schematic view illustrating a configuration of a sputter device of a first embodiment of the present invention.

As shown in FIG. 1, a sputter device 1 comprises a vacuum chamber 3 which accommodates objects to be processed (not shown) and performs film forming process to the objects to be processed, a plurality of sputter evaporation sources (sputter cathodes) 4 provided in the vacuum chamber 3, and a power supply device 2 for supplying power for glow discharge to the sputter evaporation sources 4. In an example in FIG. 1, four sputter evaporation sources 4 are disposed in the vacuum chamber 3. The sputter device 1 is also appropriately provided with other units necessary for sputtering film forming such as, for example, a vacuum evacuation system and a process gas introduction unit, which are known and are omitted in FIG. 1.

The power supply device 2 generates glow discharge between electrodes, i.e., the sputter evaporation sources 4 as a side of electrodes and the vacuum chamber 3 as the other side of electrodes, by supplying power to the sputter evaporation sources 4, which are electrodes attached with film materials (targets).

The power supply device 2 comprises a DC power source 20 as a DC voltage generating unit, four switching elements 21 each provided to each of the four sputter evaporation sources 4 as a pulse distribution and supply means for distributing and supplying power from the DC power source 20 to the four sputter evaporation sources 4 sequentially in a time division pulse state, four power sources 10 for base power each provided to each of the four sputter evaporation sources 4 for supplying continuous power as so-called base power to each of the sputter evaporation sources 4 in order to secure a film forming rate, and a controller 40 to control ON/OFF operation of the four switching elements 21 for adjusting power supplied from the DC power source 20 to each of the sputter evaporation sources 4. In the embodiment, the four sputter evaporation sources 4 are disposed such that the four switching elements 21 are provided corresponding thereto, as mentioned above, as well as the four power sources 10 for base power. In other words, the switching elements 21 and the power sources 10 for base power are provided in the number corresponding to that of the sputter evaporation sources 4, respectively.

Of the output terminals of the DC power source 20, the cathode (−) side is connected to the four switching elements 21 and the anode (+) side is connected to the vacuum chamber 3. Each of the switching elements 21 is connected to a corresponding sputter evaporation source 4. For each of the four power sources 10 for base power, one of the output terminals is connected to a sputter evaporation source 4 and the other is connected to the vacuum chamber 3. The power sources 10 for base power, which, as mentioned above, are power sources for supplying continuous power to the sputter evaporation sources 4 as the base power to secure a film forming rate, and examples of the power sources 10 are DC power sources, continuous DC pulse power sources, and RF (radio frequency) power sources.

The switching elements 21 can be formed using semiconductor switching elements such as IGBT (insulated gate bipolar transistor) and MOSFET. By controlling ON/OFF operation of the four switching elements 21, the controller 40 is adapted to distribute and supply power from the DC power source 20 to the four sputter evaporation sources 4 sequentially (cyclically) in a time division pulse state and to be capable of changing pulse width and pulse frequency of DC pulse voltage applied to the target.

The sputter device 1 of the first embodiment is configured as mentioned above and adapted to supply continuous power as the base power to each of the sputter evaporation sources 4 from a power source 10 for base power provided to each of a plurality, in this case four, of sputter evaporation sources 4, as well as to supply each of the sputter evaporation sources 4 with DC pulse power to be superimposed on the continuous power in a time division state, by the DC power source 20 and a switching element 21 provided to each of the sputter evaporation sources 4.

Therefore, the sputter device 1 having such configuration requires no DC pulse power source to be provided to each of the sputter evaporation sources 4, which reduces the device cost, and provides a secured film forming rate by the base power, and dense film formation on objects to be processed by the DC pulse power.

Figure 2:
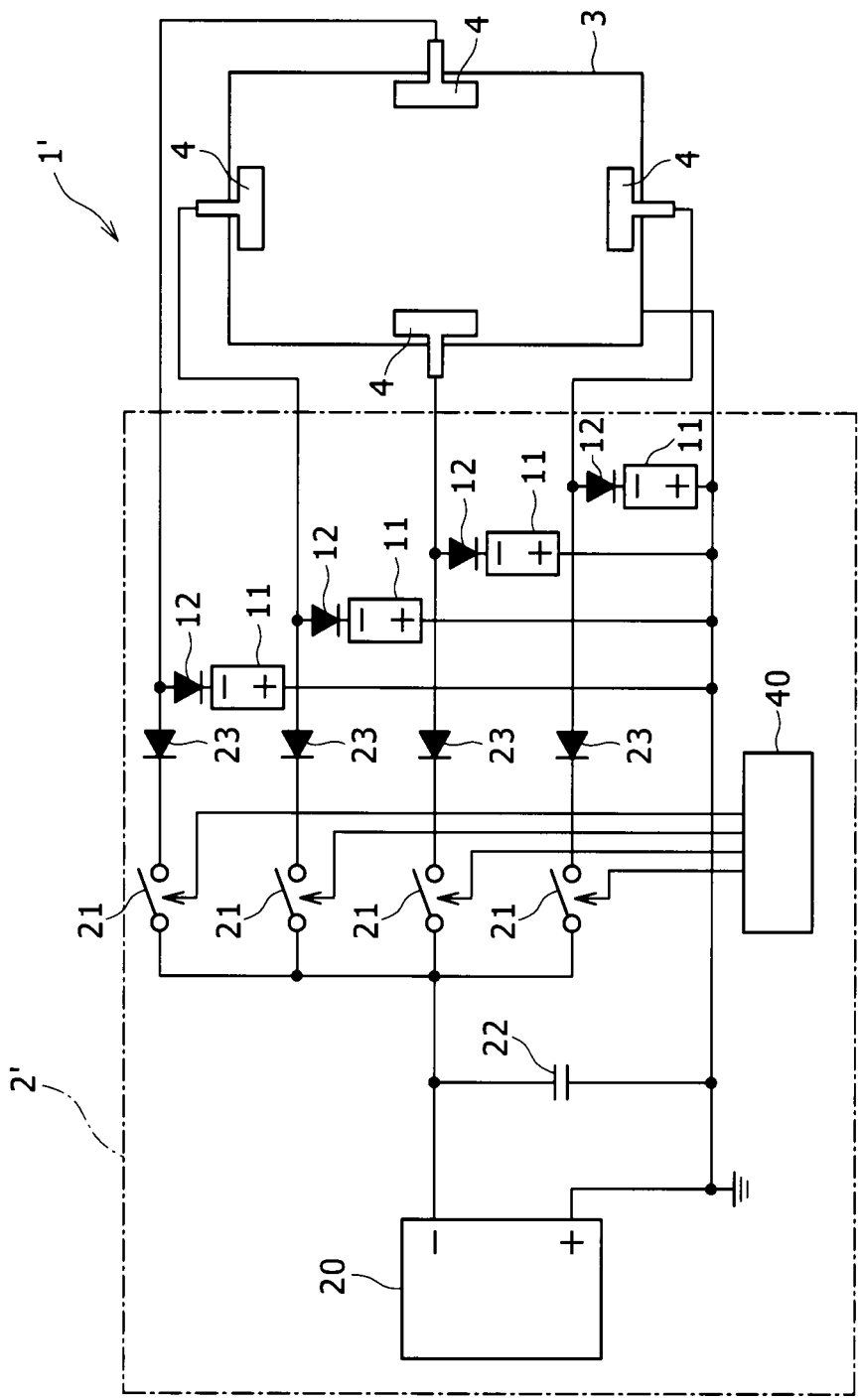
FIG. 2 is a schematic view illustrating a configuration of a sputter device of a second embodiment of the present invention.

FIG. 2 is a schematic view illustrating a configuration of a sputter device of a second embodiment of the present invention. Note that the same components in the sputter device in the FIG. 1 are given the same reference numbers in the FIG. 1. The differences from the first embodiment are that DC power sources 11 for base power are provided instead of the power sources 10 for base power, and that a power storing part 22 is provided for storing power from the DC power source 20.

As shown in FIG. 2, the sputter device 1' comprises a vacuum chamber 3, a plurality, in this example four, of sputter evaporation sources 4, and a power supply device 2' for generating glow discharge with the sputter evaporation sources 4 as cathodes by supplying power to these sputter evaporation sources 4.

The power supply device 2' comprises a DC power source 20 as a DC voltage generating unit, a capacitor 22 as a power storing part to store power from the DC power source 20, four switching elements 21 each provided to each of the four sputter evaporation sources 4 as a pulse distribution and supply means for distributing and supplying power stored in the capacitor 22 to the four sputter evaporation sources 4 sequentially in a time division pulse state, the four DC power sources 11 for base power each provided to each of the four sputter evaporation sources 4 for supplying continuous DC power as the base power to each of the sputter evaporation sources 4 in order to secure a film forming rate, and a controller 40 to control ON/OFF operation of the four switching elements 21 for adjusting power supplied from the DC power source 20 via the capacitor 22 to each of the sputter evaporation sources 4.

In the DC power source 20, the cathode (−) side is connected to the four switching elements 21 and the anode (+) side is connected to the vacuum chamber 3. The capacitor 22 is connected with the DC power source 20 in parallel. In other words, the capacitor 22 is connected to between the cathode (−) side and the anode (+) side of the DC power source 20. Each of the switching elements 21 is connected to a corresponding sputter evaporation source 4 via a diode 23 to prevent reverse flow. In each of the four DC power sources 11 for base power, the cathode (−) side is connected to a corresponding sputter evaporation source 4 via a diode 12 to prevent reverse flow and the anode (+) side is connected to the vacuum chamber 3.

The sputter device 1' of the second embodiment is configured as mentioned above and adapted to supply continuous DC power as the base power to each of the sputter evaporation sources 4 from a DC power source 11 for base power provided to each of the plurality, in this case four, of sputter evaporation sources 4, as well as to supply each of the sputter evaporation sources 4 with DC pulse power to be superimposed on the continuous DC power in a time division state, where power from the DC power source 20 is stored in the capacitor 22 and then the power stored in the capacitor 22 is supplied as DC pulse power by the switching elements 21 each provided to each of the sputter evaporation sources 4.

Therefore, the sputter device 1' having such configuration requires no DC pulse power source to be provided to each of the sputter evaporation sources 4, which reduces the device cost, and provides a secured film forming rate by the base power, and dense film formation on objects to be processed by the DC pulse power. This allows large momentary current to be released from the capacitor 22 when DC pulse power is supplied, reducing the power capacity of the DC power source 20 as well as downsizing the DC power source 20.

Figure 3:
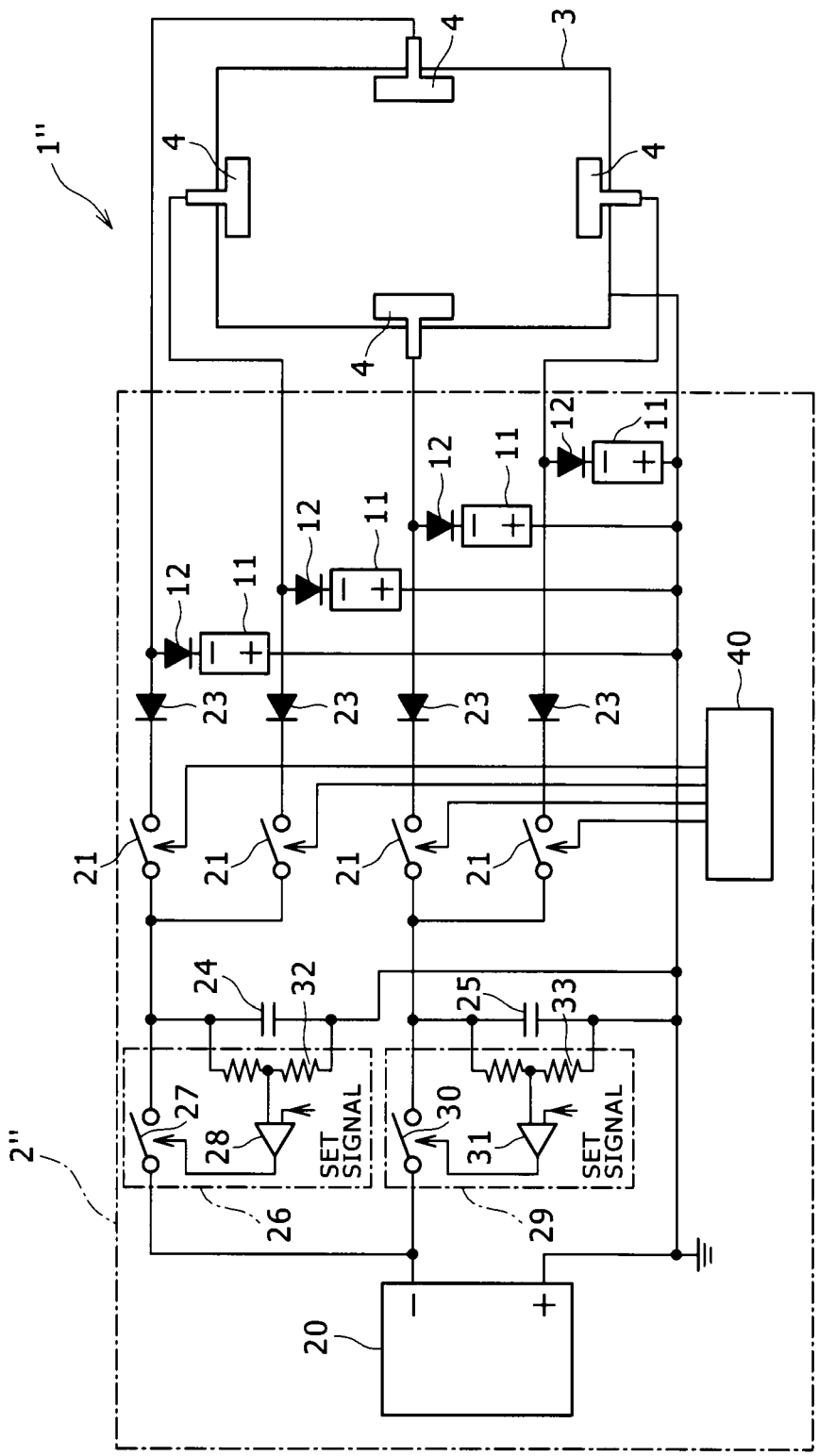
FIG. 3 is a schematic view illustrating a configuration of a sputter device of a third embodiment of the present invention.

FIG. 3 is a schematic view illustrating a configuration of a sputter device of a third embodiment of the present invention. Note that the same components in the sputter device 1' in the FIG. 2 are given the same reference numbers in the FIG. 2. The difference from the second embodiment is that two, i.e., a first and a second, capacitors 24 and 25 with charging voltage adjustment means are provided instead of the capacitor 22.

As shown in FIG. 3, the sputter device 1" comprises a vacuum chamber 3, a plurality, in this example four, of sputter evaporation sources 4, and a power supply device 2" for generating glow discharge with the sputter evaporation sources 4 as cathodes by supplying power to these sputter evaporation sources 4.

The power supply device 2" comprises a DC power source 20 as a DC voltage generating unit, the first capacitor 24 and the second capacitor 25 connected to the DC power source 20 in parallel as power storing parts to store power from the DC power source 20, the charging voltage adjustment means 26 and 29 each provided to each of the capacitors 24 and 25 for adjusting the charging voltages to the capacitors 24 and 25 at predetermined values, four switching elements (a pulse distribution and supply means) 21 for supplying power stored in the first capacitor 24 to two sputter evaporation sources 4 in a time division pulse state as well as for supplying power stored in the second capacitor 25 to the other two sputter evaporation sources 4 in a time division pulse state, four DC power sources 11 for base power each provided to each of the sputter evaporation sources 4 for supplying continuous DC power as the base power to each of the sputter evaporation sources 4, and a controller 40 to control ON/OFF operation of the four switching elements 21 for adjusting power supplied from the DC power source 20 via the capacitor 22 to each of the sputter evaporation sources 4.

The charging voltage adjustment means 26, which controls and adjusts the charging voltage from the DC power source 20 to the first capacitor 24 at a predetermined value, comprises a switching element 27 such as MOSFET or IGBT, a resistor 32 for detecting the charging voltage of the first capacitor 24, and a comparator 28, which compares the detected value of the charging voltage of the capacitor 24 with a predetermined set value and controls switching of the switching element 27 based on the comparison result, so that the charging voltage of the first capacitor 24 becomes the predetermined set value.

Similarly, the charging voltage adjustment means 29, which controls and adjusts the charging voltage from the DC power source 20 to the second capacitor 25 at a predetermined value, comprises a switching element 30, a resistor 33 for detecting the charging voltage of the second capacitor 25, and a comparator 31, which compares the detected value of the charging voltage of the capacitor 25 with a predetermined set value and controls switching of the switching element 30 based on the comparison result, so that the charging voltage of the second capacitor 25 becomes the predetermined set value.

In the third embodiment, two out of the four switching elements 21 are connected to the cathode side of the first capacitor 24 and the other two switching elements 21 are connected to the cathode side of the second capacitor 25.

In the case of the third embodiment, the charging voltages of capacitors 24 and 25 can be set to each of the sputter evaporation sources 4, enabling pulse power to be set to each of the sputter evaporation sources 4.

The sputter device 1" of the third embodiment is configured as mentioned above and adapted to supply continuous DC power as the base power to each of the sputter evaporation sources 4 from a DC power source 11 for base power provided to each of the plurality, in this case four, of sputter evaporation sources 4, as well as to supply each of the sputter evaporation sources 4 with DC pulse power to be superimposed on the continuous DC power in a time division state.

When the DC pulse power is supplied, power from the DC power source 20 is stored in each of the first capacitor 24 with the charging voltage adjusted to a predetermined value by the charging voltage adjustment means 26 and the second capacitor 25 with the charging voltage adjusted to a predetermined value by the charging voltage adjustment means 29, and then the power stored in the first capacitor 24 is supplied to two sputter evaporation sources 4 out of the four sputter evaporation sources 4 in a time division pulse state by the two switching elements 21 connected to the first capacitor 24, and the power stored in the second capacitor 25 is supplied to the other two of the four sputter evaporation sources 4 in a time division pulse state by the two switching elements 21 connected to the second capacitor 25.

Therefore, the sputter device 1" having such configuration requires no DC pulse power source to be provided to each of the sputter evaporation sources 4, which reduces the device cost, and enables the charging voltage to each of the first and second capacitors 24 and 25 to be adjustable so that pulse power to each of the sputter evaporation sources 4 can be set, thereby enhancing adaptability of simultaneous sputtering with targets of different materials and allowing precise control for the distributions of film thickness and film quality on objects to be processed, in addition to the aforementioned effect of providing a secured film forming rate by the base power and dense film formation on objects to be processed by the DC pulse power.

Technologies with various aspects are herein disclosed as mentioned above, major technologies of which are summarized below.

A sputter device according to an aspect of the present invention comprises a plurality of sputter evaporation sources, and a power supply device for supplying power to a plurality of the sputter evaporation sources, wherein the power supply device comprises a DC voltage generating unit, a pulse distribution and supply means connected to the cathode side of the DC voltage generating unit for distributing and supplying power from the DC voltage generating unit to each of the sputter evaporation sources sequentially in a time division pulse state, and a power source provided to each of a plurality of the sputter evaporation sources for supplying continuous power to each of the sputter evaporation sources.

The sputter device having such configuration supplies continuous power as the base power to each of the sputter evaporation sources from a power source provided to each of the sputter evaporation sources, as well as supplies each of the sputter evaporation sources with DC pulse power to be superimposed on the continuous power in a time division state by the DC voltage generating unit and the pulse distribution and supply means.

Thus, the sputter device having such configuration requires no DC pulse power source to be provided to each of the sputter evaporation sources, which reduces the device cost, and provides a secured film forming rate by the continuous power, and dense film formation on objects to be processed by the DC pulse power.

In the sputter device according to another aspect, the power supply device further comprises a power storing part to store power from the DC voltage generating unit, wherein the pulse distribution and supply means distributes and supplies power stored in the power storing part to each of the sputter evaporation sources sequentially in a time division pulse state. A sputter device according to another aspect comprises a power supply device for supplying power to a plurality of sputter evaporation sources, wherein the power supply device comprises a DC voltage generating unit, a power storing part for storing power from the DC voltage generating unit, a pulse distribution and supply means connected to the cathode side of the power storing part for distributing and supplying power stored in the power storing part to each of the sputter evaporation sources sequentially in a time division pulse state, and a DC power source provided to each of the sputter evaporation sources for supplying continuous DC power to each of the sputter evaporation sources.

In the sputter device according to another aspect, the power storing part preferably comprises a capacitor, and the pulse distribution and supply means preferably comprises switching elements.

The sputter device having the configuration supplies continuous DC power to each of the sputter evaporation sources from a DC power source provided to each of the sputter evaporation sources, as well as supplies each of the sputter evaporation sources with DC pulse power to be superimposed on the continuous DC power in a time division state, where power from the DC voltage generating unit is stored in the power storing part and then the power stored in the power storing part is supplied as the DC pulse power by the pulse distribution and supply means.

Therefore, in addition to the above effects, the sputter device having the configuration allows large momentary current to be released from the power storing part when the DC pulse power is supplied, reducing the power capacity of the DC voltage generating unit.

In the sputter device according to another aspect, the power supply device further comprises a first and second power storing parts to store power from the DC voltage generating unit, and charging voltage adjustment means provided in each of the power storing parts for adjusting the charging voltage to each of the power storing parts at a predetermined value, wherein the pulse distribution and supply means supplies power stored in the first power storing part to some of the sputter evaporation sources in a time division pulse state and supplies power stored in the second power storing part to the others of the sputter evaporation sources in a time division pulse state. A sputter device according to an another aspect comprises a power supply device for supplying power to a plurality of sputter evaporation sources, wherein the power supply device comprises a DC voltage generating unit, a first and second power storing parts connected to the DC voltage generating unit in parallel to store power from the DC voltage generating unit, charging voltage adjustment means provided in each of the power storing parts for adjusting the charging voltage to each of the power storing parts at a predetermined value, a pulse distribution and supply means for supplying power stored in the first power storing part to some of the sputter evaporation sources in a time division pulse state and for supplying power stored in the second power storing part to the others of the sputter evaporation sources in a time division pulse state, and a DC power source provided to each of a plurality of the sputter evaporation sources for supplying continuous DC power to each of the sputter evaporation sources.

In the sputter device according to another aspect, the first and second power storing parts preferably comprise capacitors, and the pulse distribution and supply means preferably comprises switching elements.

The sputter device having the configuration supplies continuous DC power to each of the sputter evaporation sources from the DC power source provided to each of the sputter evaporation sources, as well as supplies each of the sputter evaporation sources with DC pulse power to be superimposed on the continuous DC power in a time division state.

When the DC pulse power is supplied, power from the DC voltage generating unit is stored in each of the first and second power storing parts with the charging voltages adjusted to predetermined values by the charging voltage adjustment means, and, by the pulse distribution and supply means, the power stored in the first power storing part is supplied to some of the sputter evaporation sources in a time division pulse state and the power stored in the second power storing part is supplied to the others of the sputter evaporation sources in a time division pulse state.

Thus, the sputter device having the configuration requires no DC pulse power source to be provided to each of the sputter evaporation sources, which reduces the device cost, and enables the charging voltage to be adjustable for each of the first and second power storing parts so that pulse power can be set for each of the sputter evaporation sources, thereby enhancing adaptability of simultaneous sputtering with targets of different materials and allowing precise control for the distributions of film thickness and film quality on objects to be processed, in addition to the aforementioned effect of providing a secured film forming rate and dense film formation on objects to be processed.

This application is based on Japanese Patent Application No. 2008-229805 filed on Sep. 8, 2008, and the content of the application is incorporated herein by reference in its entirety.

The present invention has been described above appropriately and sufficiently with embodiments in reference to drawings to describe the present invention, but it should be recognized that variation and/or modification can easily be applied to the above embodiments by those skilled in the art. Thus, it is understood that any variation or modification made by those skilled in the art should be included in the scope of the claims unless the variation or modification deviate from the scope of the claims.

INDUSTRIAL APPLICABILITY

The present invention provides a sputter device for forming film on objects to be processed by the sputtering method.

The invention claimed is:

1. A sputter device, comprising:
a plurality of sputter evaporation sources; and
a power supply device for supplying power to a plurality of said sputter evaporation sources, wherein
said power supply device comprises
a power source provided to each of a plurality of said sputter evaporation sources and connected to said plurality of sputter evaporation sources so as to supply continuous power to each of said sputter evaporation sources,
a DC voltage generating unit common to said plurality of sputter evaporation sources, and
a pulse distribution and supply system connected to the cathode side of said DC voltage generating unit, wherein the pulse distribution and supply system includes a switching element connected between said cathode side of said DC voltage generating unit and each of said sputter evaporation sources, said switching elements each being positionable in ON and OFF states to selectively connect the cathode side of said DC voltage generating unit and a respective one of said sputter evaporation sources, and a controller connected and configured to control the respective switching elements to selectively assume the ON state, to thereby distribute and supply pulsed power from said DC voltage generating unit to each of said sputter evaporation sources sequentially in a time division pulse state.

2. The sputter device according to claim 1, wherein said power supply device further comprises:
a power storing part to store power from said DC voltage generating unit,
wherein said power storing part is connected to said pulse distribution and supply system such that power stored in said power storing part is distributed and supplied to each of said sputter evaporation sources sequentially in a time division pulse state.

3. The sputter device according to claim 2, wherein said power storing part comprises a capacitor, and said pulse distribution and supply system comprises a switching element for each of said plurality of sputter evaporation sources.

4. The sputter device according to claim 1, wherein said power supply device further comprises:
a first and second power storing parts to store power from said DC voltage generating unit, and
a charging voltage adjustment means provided in each of said power storing parts for adjusting the charging voltage to each of said power storing parts at a predetermined value, wherein
said pulse distribution and supply system is configured to supply power stored in said first power storing part to some of said sputter evaporation sources in a time division pulse state, and to supply power stored in said second power storing part to the others of said sputter evaporation sources in a time division pulse state.

5. The sputter device according to claim 4, wherein said first and second power storing parts comprise capacitors and said pulse distribution and supply means comprises a switching element for each of said plurality of sputter evaporation sources.

6. The sputter device according to claim 1, wherein the DC voltage generating unit common to said plurality of sputter evaporation sources supplies DC power having the same polarity as said continuous power, whereby the pulsed power is superimposed onto said continuous power.

* * * * *